United States Patent [19]

Swartz et al.

[11] 3,783,348

[45] Jan. 1, 1974

[54] ENCAPSULATED SEMICONDUCTOR DEVICE ASSEMBLY

[75] Inventors: George Allan Swartz, Princeton, N.J.; Richard Earl Chamberlain, Yardley, Pa.

[73] Assignee: RCA Corporation, New York, N.Y.

[22] Filed: Oct. 30, 1972

[21] Appl. No.: 302,182

[52] U.S. Cl. ....... 317/234 R, 317/234 E, 317/234 F, 317/234 N, 317/234 M

[51] Int. Cl. ............................ H01l 3/00, H01l 5/00

[58] Field of Search ........................ 317/234, 1, 5, 3, 317/3.1, 4, 4.1, 5.3, 5.4, 5

[56] References Cited

UNITED STATES PATENTS

| | | | |
|---|---|---|---|
| 2,935,665 | 5/1960 | Coyle | 317/234 G |
| 3,274,667 | 9/1966 | Siebertz | 317/235 J |
| 3,295,089 | 12/1966 | Moore | 317/234 G |
| 3,320,497 | 5/1967 | Neuf | 317/234 G |
| 3,550,228 | 12/1970 | Asscher | 317/234 E |
| 3,614,550 | 10/1971 | Marinace | 317/234 E |

FOREIGN PATENTS OR APPLICATIONS

| | | | |
|---|---|---|---|
| 910,979 | 11/1962 | Great Britain | 317/234 E |
| 1,266,551 | 6/1961 | France | 317/234 J |

*Primary Examiner*—John S. Heyman
*Assistant Examiner*—Andrew J. James
*Attorney*—Glenn H. Bruestle et al.

[57] ABSTRACT

A semiconductor assembly is presented which uses an encapsulated semiconductor device with a substantially U-shaped contact ribbon bonded thereto. The contact ribbon has elbows which extend beyond the surface of the semiconductor device. Upon the application of direct, downward pressure at the ends of the contact ribbon, the downward pressure is transferred to and absorbed by the encapsulating material. This assembly allows for very short lead length to the semiconductor device while at the same time shielding the semiconductor device from direct pressure.

12 Claims, 2 Drawing Figures

ENCAPSULATED SEMICONDUCTOR DEVICE ASSEMBLY

BACKGROUND OF THE INVENTION

The present invention relates to semiconductor assemblies and more particularly to assemblies for encapsulated high frequency semiconductor devices.

In the manufacture of semiconductor devices a method of electrically connecting the semiconductor devices to the outside world is needed. In the past, this need has been met by such means as direct pressure contacts to the semiconductor device as well as by indirect pressure contacts sometimes employing stand-off systems. Direct pressure upon semiconductor devices used at high frequency is undesirable because of the small size needed for semiconductor devices which are used at such frequencies and because of the great likelihood of damaging such small devices by direct pressure.

Some stand-off systems have met the need of providing electrical contact to the semiconductor device without applying direct pressure upon the device. However, in these systems, the stand-offs have been separated from the semiconductor device requiring a wire lead from the stand-off to the device. In many cases, the characteristics of these wire leads at high frequency have nullified the utility of the particular semiconductor device being used due to the relatively high inductance presented by the wire leads. This phenomenon has particularly been present in semiconductor devices which are used at microwave frequencies.

In order to circumvent the disadvantages of stand-off systems and to shorten the lead lengths of wire contacts there have been attempts at attaching leads directly to the semiconductor devices and encapsulating these leads to give them support. In the past, however, these encapsulated leads have applied direct pressure upon the semiconductor device being used thereby creating a great likelihood that the pressure would damage the device.

SUMMARY OF THE INVENTION

A semiconductor assembly is presented which comprises a base, a semiconductor device having an exposed contact surface mounted on the base, a contact ribbon bonded to the contact surface of the semiconductor device and having elbows which extend beyond the contact surface of the semiconductor device and overhang the base, a pressure-absorbing contact at the end of the contact ribbon, and an insulating plastic material encapsulating the semiconductor device and the contact ribbon except for the pressure-absorbing contact.

DETAILED DESCRIPTION

Figure 1:
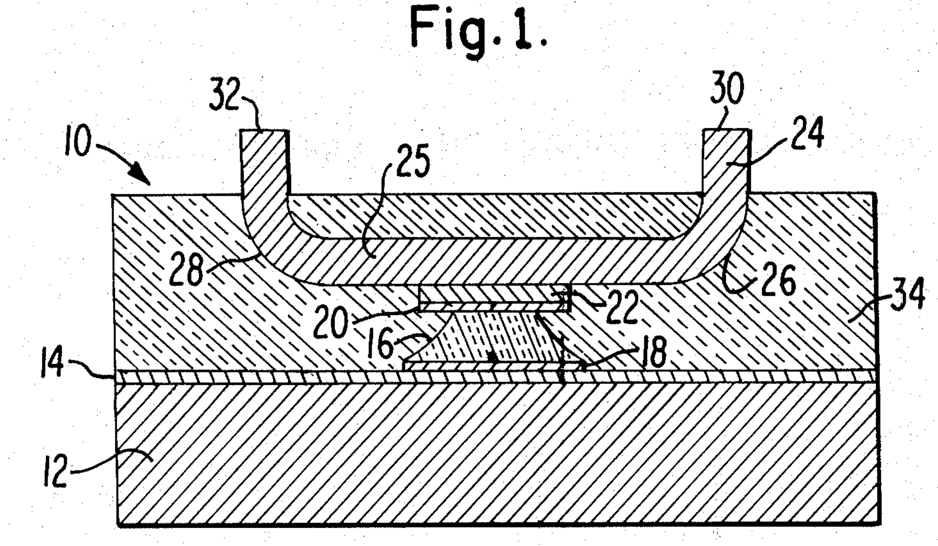
FIG. 1 is a sectional view of one embodiment of the semiconductor assembly of the present invention being used with an IMPATT diode.

Referring generally to FIG. 1, semiconductor assembly 10 is shown in use with a silicon IMPATT diode 16. The IMPATT diode 16 does not constitute a part of the present invention and is used only for illustrative purposes. The present invention may be used with any type of semiconductor device, such as a diode or a transistor, which is to be used at a frequency which is high enough for lead inductance to be a non-negligible consideration. IMPATT diode 16 is a high-frequency semiconductor device which may be used as a microwave oscillator. IMPATT diodes are generally known in the semiconductor art.

The encapsulated high-frequency semiconductor device 10 is comprised of an electrically conductive base structure which may be a heat sink 12 made of a material which is a good conductor of heat such as copper or silver. The heat sink 12 has a gold layer 14 deposited thereon by any commonly known technique such as by vacuum evaporation or by electroplating. The IMPATT diode 16 has a lower chromium adherence layer 18 and an upper chromium adherence layer 20. The chromium layers 18, 20 are used because chromium adheres well to semiconductor materials such as silicon which comprise the IMPATT diode 16. In addition, chromium is a conductive material which allows a good electrical contact to the semiconductor material used to fabricate the IMPATT diode 16 and which provides a barrier to prevent diffusion of gold from the gold contact layer 14 which is deposited upon the heat sink 12. The IMPATT diode 16 is bonded, such as by thermobonding, to the gold contact layer 14 deposited upon the heat sink 12.

A gold contact surface 22 is deposited on the upper chromium adherence layer 20 of the IMPATT diode 16. This gold contact surface 22 may be deposited by any commonly known method such as by electroplating or by vacuum evaporation.

A conductive wire or contact ribbon 24 which is preferably substantially U-shaped and made of a relatively thin and conductive material, such as a 1 mil by 3 mil gold ribbon, is thermobonded to the gold contact surface 22 of the IMPATT diode 16. Alternatively, a relatively thin, conductive wire, such as a 1 mil gold wire can be ultrasonically bonded to the contact surface 22. The contact ribbon 24 has a lower portion 25 which is substantially parallel to the top surface of the IMPATT diode 16 for a short distance extending beyond either side of the contact surface 22 and overhanging the heat sink 12. The amount by which the portion 25 of the contact ribbon 24 overhangs the heat sink 12 may typically be from 1 to 3 mils on either side of the contact surface 22 at which point upward bends or elbows 26, 28 are formed in the contact ribbon 24. A short distance above these elbows 26, 28 the gold contact ribbon 24 terminates leaving two exposed contacts 30, 32 onto which a pressure contact to the assembly 10 may be made. The IMPATT diode 16 and the lower portion 25 of the U-shaped gold contact ribbon 24 are encapsulated with an insulating, resilient plastic material 34 which may preferably be a polyimide or which may be an insulating epoxy or other suitable insulating plastic.

The completed assembly 10 will have very short leads between pressure contacts 30, 32 and the contact surface 22 of the IMPATT diode 16. Typically, these leads will be less than 5 mils in length. This allows for very high-frequency operation, upwards of 50 gigahertz, of the IMPATT diode 16 without interference due to the inductance of the leads used in the assembly 10. At the same time, the resilient plastic encapsulating material 34 absorbs substantially all of the direct pressure applied to the pressure contacts 30, 32 by flexing downwards upon the application of pressure of the overhanging elbows 26, 28 from the contacts 30, 32. The resilient plastic encapsulating material 34 together with the overhanging elbows 26, 28 effectively removes all direct pressure from the IMPATT diode 16 and protects the IMPATT diode 16 from external damage.

The semiconductor assembly 10 of the present invention thereby accomplishes the dual purpose of protecting the encapsulated IMPATT diode 16 while at the same time providing for very short lead lengths of the contact wire 24 in order to allow for very high-frequency operation.

Figure 2:
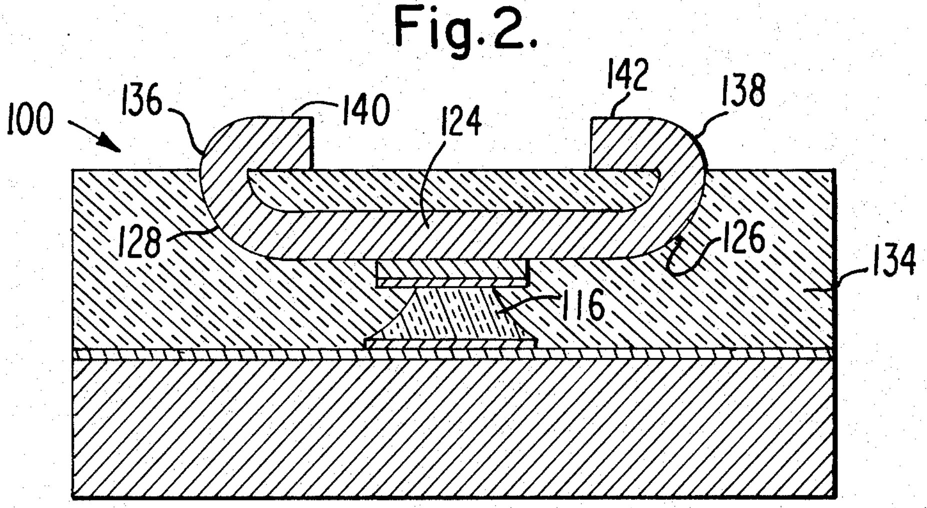
FIG. 2 is a sectional view of another embodiment of the present invention.

Referring generally to FIG. 2, another embodiment of the semiconductor assembly 100 of the present invention is shown. This embodiment 100 is substantially the same as the embodiment 10 of FIG. 1 except that a short distance above the elbows 126, 128 the gold contact ribbon 124 is again bent forming elbows 136, 138 providing two exposed contacts 140, 142 which are substantially parallel to the top of the IMPATT diode 116. In this embodiment, a pressure contact may be brought down upon the exposed contacts 140, 142 which will provide electrical contact to the IMPATT diode 116.

This embodiment 100 has the additional advantages of providing greater contact area at the electrical contacts 140, 142. When a pressure contact is brought down upon the exposed contacts 140, 142, those portions of the contact ribbon 124 which extend out of the plastic encapsulating material 134 will be flattened down against the top surface of the plastic encapsulating material 134. In all other respects, the operation and elements of this embodiment 100 are identical to the embodiment 10 disclosed in FIG. 1.

I claim:

1. A semiconductor assembly comprising:

a. a base, b. a semiconductor device having an exposed contact surface mounted on said base, c. a contact ribbon bonded to said contact surface, d. an elbow in said contact wire overhanging said base, e. a pressure-absorbing contact at the terminus of said contact ribbon and substantially above said elbow, and f. an insulating material encapsulating said semiconductor device and said contact ribbon except for said pressure-absorbing contact.

2. The semiconductor assembly of claim 1 wherein said contact ribbon is substantially U-shaped and includes a pair of elbows each overhanging said base and a pressure-absorbing contact substantially above each of said elbows.

3. The semiconductor assembly of claim 1 wherein said insulating material comprises an insulating, resilient plastic.

4. The semiconductor assembly of claim 3 wherein said insulating, resilient plastic is a polyimide.

5. The semiconductor assembly of claim 1 wherein said base is electrically conductive.

6. The semiconductor assembly of claim 1 wherein said base is a heat sink.

7. The semiconductor assembly of claim 6 further comprising a substantially U-shaped contact ribbon having a pair of elbows each overhanging said heat sink and a pressure-absorbing contact substantially above each of said elbows.

8. The semiconductor assembly of claim 7 further comprising an insulating plastic material encapsulating said semiconductor device and said contact ribbon except for said pressure-absorbing contacts.

9. The semiconductor assembly of claim 1 wherein said contact ribbon extends beyond the contact surface of said semiconductor device and has a first pair of elbows overhanging said base formed in said contact ribbon and has a second pair of elbows formed in said contact ribbon substantially above said first pair of elbows and the same distance from said first pair of elbows, whereby a pair of pressure-absorbing contacts are formed, each of which is substantially parallel to said contact surface of said semiconductor device.

10. The semiconductor assembly of claim 9 comprising an insulating plastic material encapsulating said semiconductor device and said contact ribbon except for said second pair of elbows and said pressure-absorbing contact.

11. The semiconductor assembly of claim 10 wherein said base is electrically conductive.

12. The semiconductor assembly of claim 11 wherein said base is a heat sink.

* * * * *